United States Patent [19]

Connah, Jr.

[11] 4,253,092
[45] Feb. 24, 1981

[54] MICROWAVE LEAKAGE DETECTOR

[76] Inventor: John F. Connah, Jr., 244 Jefferson Ave., St. James, N.Y. 11780

[21] Appl. No.: 31,407

[22] Filed: Apr. 19, 1979

Related U.S. Application Data

[63] Continuation-in-part of Ser. No. 863,741, Dec. 23, 1977, abandoned.

[51] Int. Cl.³ .......................................... H01H 35/00
[52] U.S. Cl. .................................. 340/539; 340/600; 307/117; 455/226
[58] Field of Search ...................... 340/539, 600, 635; 325/363, 364; 307/117; 455/226

[56] References Cited

U.S. PATENT DOCUMENTS

| 3,679,908 | 7/1972 | Mazza | 325/364 |
| 3,760,271 | 9/1973 | Bach, Jr. et al. | 325/363 |
| 4,065,758 | 12/1977 | Barbier et al. | 340/600 |

Primary Examiner—Alvin H. Waring
Attorney, Agent, or Firm—Richard L. Miller

[57] ABSTRACT

A microwave leakage detector which can be attached onto a microwave oven, or similar device, and will detect leakage of microwave signal of a predetermined frequency. The leakage detector can be removed from the oven and periodically utilized as a hand held unit for scanning around the oven door, window, and other parts. An alarm will sound when the microwave signal received is above a preset minimum amount. The preset amount can be varied as desired in order to meet safety standards.

2 Claims, 5 Drawing Figures

MICROWAVE LEAKAGE DETECTOR

This application is a Continuation-in-Part Application of Ser. No. 863,741, filed on Dec. 23, 1977 for an invention entitled "Radio Frequency Alarm System" by the inventor of the present application, now abandoned.

BACKGROUND OF THE INVENTION

This invention relates to microwave leakage detectors, and more specifically to a leakage detector which can detect microwave signals leaked from a microwave oven, or the like, when the leakage reaches above a preset level.

Microwave devices are regularly utilized for numerous applications. For example, microwave ovens are generally maintained in homes and businesses and are used for cooking and heating of foods. Also, theft prevention devices, and area protection systems utilize microwave signals for protecting an area and avoiding unauthorized intrusion. Despite the numerous utilizations of microwave energy, it has been found that microwave radiation can have detrimental effect upon humans. For example, such microwave radiation can cause blindness, cause genetic damage, etc. Also, it can interfere with the proper operation of various electronic medical devices, such as heart monitors, pacemakers, etc.

In order to avoid the damaging effect of microwave energy while still permitting the beneficial use of such energy, the government has established Federal Regulations maximizing the amount of leakage permissable from microwave devices.

For example, at present microwave ovens are allowed a maximum of 5 Milliwatts of leakage after purchase. In connection with theft prevention devices, the leakage standard has been set at a maximum of a 1 milliwatt level. The typical frequencies involved in microwave ovens are the assigned frequencies of 2.45 Gc. or 915 mhz. In connection with the theft prevention devices, the standard frequency is 915 mhz.

Although manufacturers provide for guarantees as to the safe levels of microwave leakage, the amount of leakage can increase after purchase of the device. For example, a tug on the door of the microwave oven may loosen it sufficiently to increase the amount of leakage. A piece of paper, towel, or other food particle caught in the door, might keep it ajar sufficient to permit excessive leakage of microwave energy. Food buildup caught or wedged in the corner hinge area can also increase the leakage. Warping of the door after continuous use can also modify its initial positioning whereby the leakage will be far in excess of government standards.

As a result, even though at the time of purchase the level of leakage may be less than a dangerous level, continued use will modify the amount of leakage whereby it can far exceed the maximum permissable levels.

In addition, although at the present time the levels set by Federal Regulations are believed to be safe, experience with many other items such as x-rays, smoke, etc., has shown that continued testing may reveal greater dangers than initially contemplated and stricter standards may later be needed.

Individuals having microwave ovens or other microwave devices are actually unaware of the amount of leakage that occurs from the device. Such leakage can take place from the periphery of the door, around the window, from the back, the control box, or any other location on the device having an opening. The leakage can thereby go undetected and may actually reach or even exceed the government maximum allowed. Additionally, individuals who fear that the government standard may not provide sufficient control and protection, and may want to limit the amount of leakage to an extent even greater than the government standard need an indication of such leakage.

Accordingly, there is a need of a simple, efficient, inexpensive, hand held microwave leakage detector which can be set at desired levels and which will provide an alarm signal when detecting microwave leakage of a preselected frequency greater than the set level.

SUMMARY OF THE INVENTION

It is an object of the present invention to provide a microwave leakage detector which solves the aforementioned problems.

Another object of the present invention is to provide a microwave leakage detector which can detect microwave leakage from a microwave oven, or the like, and which will sound an alarm upon detecting an excessive amount of leakage.

Yet another object of the present invention is to provide a microwave leakage detector which can be placed in a position with respect to a microwave emitting device, and which can also be utilized for periodic scanning of various apertures in the device.

Still another object of the present invention is to provide a microwave leakage detector which can be preset to detect a threshold amount of microwave leakage, and wherein the threshold amount can be varied as desired.

A further object of the present invention is to provide a microwave leakage detector which provides an audio and/or visual indication when excessive leakage is detected from a microwave device.

A further object of the present invention is to provide a microwave leakage detector which works on a battery and which provides a warning signal upon detecting a weak or defective battery.

Still an further object of the present invention is to provide a microwave leakage detector which is inexpensive, simple to operate, small in size and which is durable.

The aforementioned objects are achieved in accordance with the present invention which provides for a microwave leakage detector comprising a housing which can be coupled onto a microwave producing device. An antenna is positioned on the housing for detecting a predetermined microwave frequency from the microwave producing device. An electronic circuit contained in the housing includes a comparator having two inputs and an output. A threshold level means is coupled to one input of the comparator for setting a preselected amount of acceptable microwave leakage. The output from the antenna is coupled to the other input of the comparator. The comparator produces an output when the amount of the predetermined microwave frequency which is received by the antenna exceeds the preselected amount. An alarm device is supported by the housing means and is activated by the output of the comparator.

In an embodiment of the invention, the detector is removably attached to the microwave producting device, as for example, by Velcro fasteners, whereby the detector is positioned at an appropriate location for continuous monitoring and can also be utilized for a hand held scan of the various apertures of the microwave producing device.

The particular frequency detected can be preset so as to detect the emitted frequency of an oven, a theft prevention device, or any other microwave producing device.

The aforementioned and other objects, features and advantages of the invention will, in part, be pointed out with particularity and will, in part, become obvious from the following more detailed description of the invention, taken in conjunction with the accompanying drawing, which forms an integral part thereof.

BRIEF DESCRIPTION OF THE DRAWINGS

In the drawings.

In the various figures of the drawing, like reference characters designate like parts.

DESCRIPTION OF THE PREFERRED EMBODIMENTS

Figure 1:
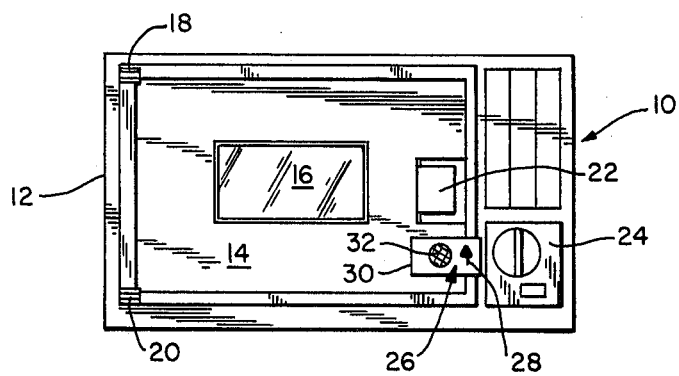
FIG. 1 is a front view of a microwave oven with the microwave leakage detector positioned along an appropriate position on the front surface thereof.

Referring now to FIG. 1, there is shown a microwave oven 10, including an outer casing 12, with a door 14 having a window 16 positioned in the door. The door is connected by means of hinges 18, 20, and includes a latch 22 for securing the door in place. A control panel 24 is included on the side of the door.

The microwave leakage detector is shown generally at 26 and is shown positioned on the door edge in overlapping relationship between the door and the casing, whereby it actually straddles the opening to thereby detect leakage through the opening that may occur from inside the microwave oven.

Because of the awareness that a limited amount of leakage may occur, and because of the dangerous effect of such microwave signals, the Federal Government has at present set a standard for microwave ovens at a maximum of 5 milliwatts per square cm. of leakage. The microwave oven typically uses a magnetron and has a frequency of 2.45 Gc, or 915 mhz.

In addition to microwave ovens, there are other microwave devices which are readily utilized. For example, theft prevention devices utilizing microwave signals are also available and operate in the 915 mhz band. These theft prevention devices have a leakage standard of 1 milliwatt.

The microwave leakage detector of the present invention is positioned so as to be located at an appropriate spot whereby it does not interfere with the operation of the microwave oven itself. At the same time, it is positioned whereby it will be able to detect microwave leakage. Accordingly, it is shown positioned adjacent to the door handle and overlapping the edge of the door.

However, although in its position it will be able to detect leakage from the area immediately beneath it, there are other locations on the microwave oven which can also produce leakage. For example, the hinges, the window, and other areas might also provide leakage. Accordingly, the device of the present invention is attached onto the microwave oven in a manner so that it can be easily removed and utilized for hand held scanning. For example, by means of a Velcro fastener, it can be maintained in a secure position on the microwave oven and at the same time easily removed for periodic scanning. One part of the Velcro fastener can be adhered onto the oven door. The other part of the Velcro fastener is placed on the back of the leakage detector whereby the leakage detector can thereby be retained in position on the microwave oven. At the same time, when desired, the device can be removed from the oven and utilized for appropriate scanning.

The detector itself includes a housing 30, having a screen 32 on the front surface, thereof through which an audio alarm can be heard. In order to facilitate mounting of the device in its appropriate place, an indicator such as arrow 28 is placed on the front of the device to correspond to the positioning of an antenna at the rear of the device. Thus, the arrow is lined up with the separation of the door and oven body so that it will be ensured that the antenna is positioned directly adjacent to that separation to receive all leakage microwave energy from the opening.

Figure 2:
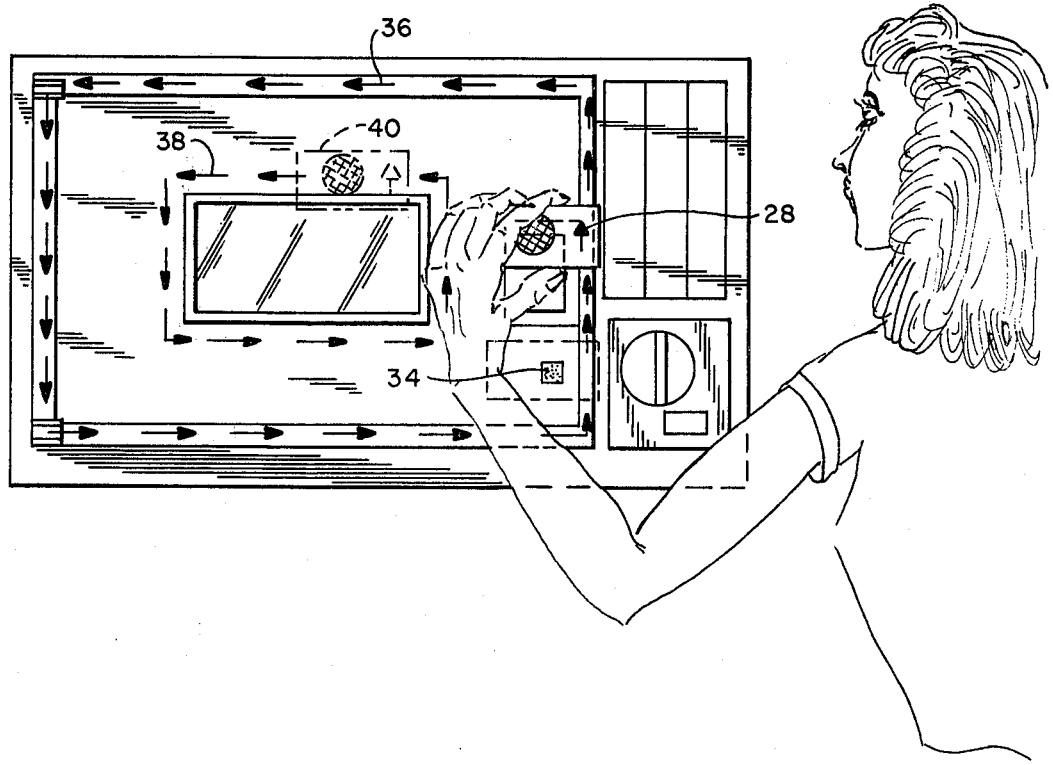
FIG. 2 is a view similar to FIG. 1 showing the leakage detector being utilized as a hand held scan device along appropriate apertures of the microwave oven.

When it is desired to scan the various apertures of the oven, scanning can be achieved as shown in FIG. 2. The detector is first removed from its position, and specifically lifted off the Velcro fastener 34 on the oven. The detector is then held in the hand and is moved along the path of the arrow 36 which will take it around the perimeter of the door seal. It should be noted that the detector is moved in the direction of the arrow indicator 28 and is moved with the arrow indicator located directly over the field being scanned. The movement is done slowly to be sure that all leakage is detected. After this path is completed, other paths can be checked. For example, the leakage path around the window area can be checked by moving it around the path of arrows 38, as shown. Other areas can also be monitored. Additionally, it is possible that the detector itself should be mounted in various positions for different times. For example, for some time, it may be desired to position the detector as shown in the dotted area 40 whereby it will detect the leakage around the window of the door. After a time, it can then be replaced to its previous position along the door edge as shown in FIG. 1.

In addition to positioning it along the door edge, it is possible that for some oven models it will require mounting of the detector on top of the oven door. Other positioning can also be achieved. However, so long as the arrow indicator is followed, it will be ensured that the antenna will be detecting the maximum amount of leakage at the door edge or other location being checked.

Figures 3, 4, 5:
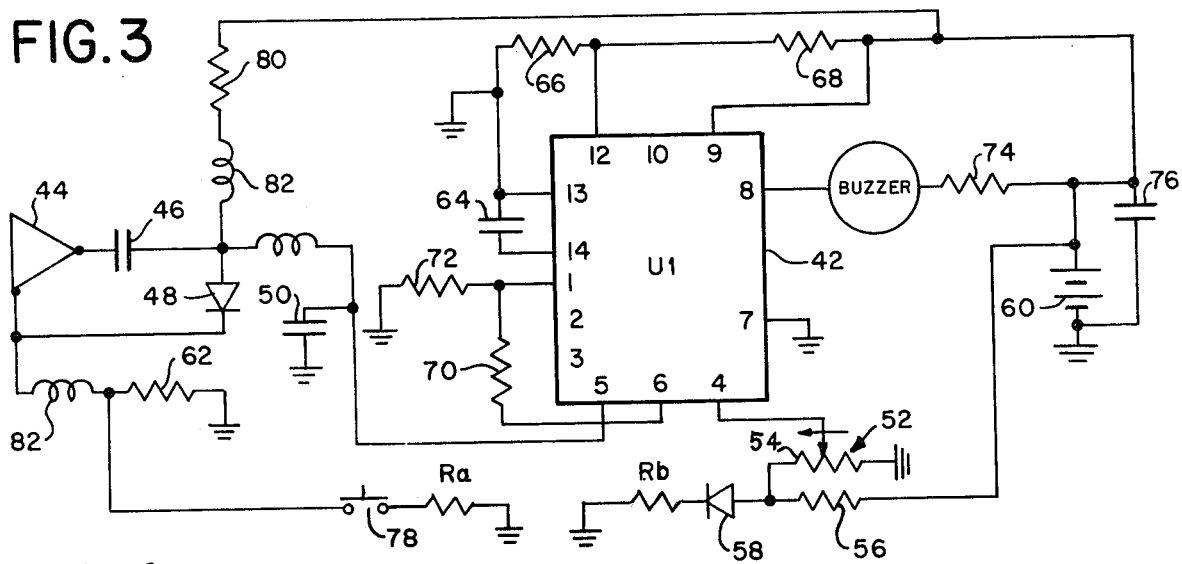
FIG. 3 is a circuit diagram showing an embodiment of the electronic circuitry of the microwave leakage detector of the present invention.
FIG. 4 is a partial circuit diagram showing a modification of the electronic circuitry in another embodiment of the electronic circuit of the microwave leakage detector of the present invention.
FIG. 5 is a simplified schematic electronic drawing explaining the operation of the electronic circuit shown in FIG. 3.

Referring now to FIG. 3, the electronic operation of the detector will now be shown. The detector includes a semiconductor unit 42 identified as U1, and refers to the smoke detector unit LM1801 sold by National Semiconductor Corporation. This semiconductor unit is readily available and description thereof is known. The semiconductor unit is mounted in a dual inline package and has 14 pins. The unit includes a comparator having a positive and negative input, with an output that is inverted and serves as one input to an OR gate. The output from the OR gate passes through a transistor and provides an output voltage which can feed an alarm signal such as a horn, LED visual indicator, etc. A low battery detector and oscillator circuit is included in the unit and by means of external resistors the value of the low battery voltage can be detected. The output of this oscillator serves as another input to the OR gate whereby, upon detection of low battery voltage, the alarm will sound. A test button can also be interconnected to the unit to provide a pulse input which is also applied to the OR gate, whereby testing of the circuit can be achieved manually to sound the alarm. A bias and regulator circuit is also included, whereby the bias current can be set and whereby reference voltages are available for utilization by smoke detector device such as a photoelectric smoke alarm or an ionization chamber detector.

The pins available on the semiconductor unit are identified in FIG. 3 and are utilized as follows: Pin 1 is used as the set bias current; Pins 2 and 3 are available as reference voltage signals from a bias and regulator circuit included in the unit, and are not utilized in the present circuit; Pin 4 constitutes the reference input to the comparator, while Pin 5 constitutes the negative input to the comparator; Pin 6 is utilized for feedback current; and Pin 7 is for the high current output; Pin 8 is utilized as the output of the unit and is used to drive the audio or visual signal; Pin 9 is connected to the battery voltage supply and typically a 9 volt battery; Pin 10 is utilized for the manual testing switch, and at the same time it is also available for parallel alarm output whereby a number of detectors can be connected in parallel; Pin 11 is a sense pin which is not utilized; Pin 12 is for battery sensing; Pin 13 is connected to ground, and Pin 14 is for a timing capacitor.

The present invention makes use of the aforementioned semiconductor unit and modifies the associated circuitry whereby the unit is utilized as a microwave leakage detector. An antenna 44 is used for detecting the microwave signal. The antenna is set by means of a frequency resonant tuned circuit to detect either the 2.45 Gc or the 915 mhz signal, or for the matter any other signal as desired. The antenna is a loop type with a circumference of ⅛ to ¼ of the wave length at the desired frequency.

At the output of the antenna is a capacitor 46 whose output is coupled to the negative input pin 4 at entry to the comparator on the unit. A diode 48 is interconnected between the capacitor and the antenna 44. A further capacitor 50 is connected between the pin 4 and ground.

The positive input pin 4 is connected to a variable potentiometer shown generally at 52 and including a resistor 54 with a moveable top. One end of resistor 54 is connected to ground and its other end connected through resistor 56 to the positive terminal of the battery 60. The end potentiometer 52 is also connected through diode 58 to a connection point between ground by way of resistor 62, and feed back path to the antenna.

A timing capacitor 64 interconnects the pins 13 and 14. The voltage dividing resistors 66, 68 are interconnected between the positive side of the battery and the pins 9, 12 and 13. Pin 7 is grounded and the appropriate feedback and biasing is provided between pins 1 and 6 by means of the resistors 70 and 72.

The output from the device on pin 8 passes through an alarm such as a buzzer, and a series resistor 74 to interconnect to the positive terminal of the battery. A capacitor 76 is interconnected across the battery. A manual switch 78 is interconnected between the positive voltage at pin 9 and pin 10. The diode 48 is positively biased from the battery 60 through resistor 80.

The operation of the circuit shown in FIG. 3 can best be explained with respect to FIG. 5, wherein like parts are identified in a like manner. In its quescient state, without any microwave signal being detected, the voltage applied at the terminal 5, the negative terminal of the comparator, is designated V1. The voltage applied at the positive terminal pin 4, of the comparator is designated as V2. Initially, the value of V1 is set slightly higher than V2 to be sure that the comparator is in its off state. The two diodes 48 and 58, respectively designated as D1 and D2, are the same thereby temperature changes are minimal since both will vary the same with temperature.

When the antenna detects a microwave voltage at the particular frequency to which it is tuned, a microwave signal impinges on the antenna and causes the capacitor 46, designated as C1, to produce a negative voltage due to the microwave detection of the diode D1. The change of voltage across the capacitor C1 causes a negative change of voltage at V1. As a result, V1 becomes less than V2 and the output of the comparator turns on. There is produced an output V3 which thereby causes the alarm to set off. The alarm can either be the buzzer, as designated in FIG. 3, or visual device such as an LED or other visual indicator as shown in FIG. 5 at 85.

The level of the voltage V2 is set by means of the variable potentiometer R1. Accordingly, the level can be set at 5 milliwatts per square centimeter in accordance with the Government requirements for microwave ovens, or at one milliwatt for regulations concerning theft prevention devices. However, if more stringent requirements are desired, experiments have shown that the setting can be as low as 10 microwatts per centimeter.

In operating the device, both the diodes D1 and D2 are slightly forward biased by means of the voltages applied whereby they sustain a current of between 5 and 20 microamps.

The resistors 66 and 68 shown in FIG. 3 can be set to determine the lower limit at which the low battery alarm will operate. For example, if a 9 volt battery is utilized, the resistors can be set to give a warning when the battery goes below 8.2 volts. This will also cause the alarm to sound. The switch 78 is also available for testing the circuit and determining if the battery as well as the rest of the circuit is operative. By depressing the switch 78, the alarm should sound indicating the operability of the system.

Referring now to FIG. 4 there is shown a modification of the circuit. As was appreciated in connection with the circuits of FIGS. 3 and 5, the output from the antenna was fed to the negative input of the comparator and the fixed voltage level establishing the threshold of acceptance was connected to pin 4, the positive input. As a result, the received microwave signal had an effect of reducing the negative value at the input to the comparator. The circuit can be modified, as shown in FIG. 4, whereby the output from the antenna is fed directly to the positive input of the comparator at pin 4, and the threshold level setting means is connected to the negative input at pin 5.

Specifically, as shown in FIG. 4, there is provided the antenna 44 having at its output a capacitor 84 in series with a diode 86 which is slightly forward biased through the resistor 88 by means of the voltage from the battery. The output is connected to pin 4. However, at the same time, connected in parallel thereto, are the resistors 90 and 92. A line 94 is interconnected between the antenna and the interconnection between the two resistors. The capacitor 96 is also connected in parallel across the resistor 90. The threshold level of accepted leakage is set by means of the variable potentiometer 98 whose output feeds the pin 4. The other end of the variable potentiometer passes through the diode 100 and the resistor 102 and is connected to the positive voltage supply.

In operation of the circuit shown in FIG. 4, initially, the negative bias applied from the variable potentiometer 98 is greater than that applied through the antenna, and accordingly, the comparator inside the semiconductor unit will be turned off. When a microwave signal is received, it causes a negative voltage at the pin 5 whereby the comparator will be turned on and caused to produce an output which will be sent to energize and activate the alarm.

In the event that Government standards should change from the present standards, the device is designed and engineered to be calibrated to go as low as 10 microwatts or as high as 50 milliwatts by adjusting the variable potentiometer.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. A microwave leakage detector comprising:
   a housing means;
   coupling means for retaining the housing onto a microwave producing device;
   an antenna positioned on the housing means for detecting a predetermined microwave frequency from the microwave producing device;
   an electric circuit contained in said housing means and comprising a comparator, a threshold level means coupled to one input of the comparator for setting a preselected amount of acceptable microwave leakage, the output from the antenna coupled to the other input of the comparator, said comparator producing an output when the amount of said predetermined microwave frequency received exceeds said preselected amount, and an alarm means supported by said housing means and activated by the output of said comparator, wherein said threshold level means comprises a variable potentiometer, whose output is coupled to the positive input of the comparator, and further comprising a capacitor serially connected between said antenna and the negative input of the comparator, a first diode and a microwave choke connected in series and placed in parallel across said capacitor, a direct connection between said antenna and the interconnection between said first diode and said choke, and a second diode interconnected between a resistor and said potentiometer, whereby a microwave signal received by said antenna causes the capacitor to produce a negative voltage, whereby upon receiving sufficient leakage microwave signals, the voltage at the negative input to the comparator is sufficiently reduced below the positive voltage to cause the comparator to produce an output.

2. A microwave leakage detector comprising:
   a housing means;
   coupling means for retaining the housing onto a microwave producing device;
   an antenna positioned on the housing means for detecting a predetermined microwave frequency from the microwave producing device;
   an electronic circuit contained in said housing means and comprising a comparator, a threshold level means coupled to one input of the comparator for setting a preselected amount of acceptable microwave leakage, the output from the antenna coupled to the other input of the comparator, said comparator producing an output when the amount of said predetermined microwave frequency received exceeds said preselected amount, and an alarm means supported by said housing means and activated by the output of said comparator, wherein said threshold level means comprises a variable potentiometer whose output is coupled to the negative input of the comparator, and further comprising a first capacitor and first diode serial connected between the antenna and the negative input of the comparator, first and second resistors connected in series and coupled in parallel across said first capacitor and first diode, a second capacitor coupled in parallel across a first one of said resistors, a direct connection between said antenna and the connection point between said first and second resistors, a direct connection between said potentiometer and a second diode coupled between said potentiometer and a resistor whereby upon receiving sufficient leakage microwave signals the voltage at the positive input to the comparator is sufficiently increased above the negative voltage to cause the comparator to produce an output.

* * * * *